United States Patent [19]

Hemingway

[11] Patent Number: 4,737,734
[45] Date of Patent: Apr. 12, 1988

[54] CONTROLLING A SEMI-CONDUCTOR RESISTANCE DEFINING COMPONENT

[75] Inventor: Thomas K. Hemingway, Stevenage, United Kingdom

[73] Assignee: British Aerospace Plc, London, United Kingdom

[21] Appl. No.: 887,617

[22] Filed: Jul. 21, 1986

[30] Foreign Application Priority Data

Jul. 22, 1985 [GB] United Kingdom ............... 8518355

[51] Int. Cl.⁴ .............................................. H03G 3/10
[52] U.S. Cl. ..................................... 330/278; 330/279
[58] Field of Search ............... 330/278, 279, 285, 304, 330/107, 109

[56] References Cited

U.S. PATENT DOCUMENTS 4,077,014 2/1978 Satoh .................................. 330/278

*Primary Examiner*—Gene Wan
*Attorney, Agent, or Firm*—Cushman, Darby & Cushman

[57] ABSTRACT

The drain-to-source resistance of a field-effect transistor (FET) can be used as a variable resistor controlling say the gain of an AGC amplifier, the AGC signal being applied to the gate of the FET. However, the resistance is dependent not only upon the gate drive but also on the device characteristics which vary even from one sample to another of the same device type. Thus, replacing the FET in say an AGC amplifier may well change the amplifier characteristics. Similarly, it may be difficult to ensure that multiple reproductions of the amplifier operate uniformly. Herein, an FET of which the drain-to-source resistance controls the gain of an amplifier is implemented as one of two matched FET's in a dual FET device. The same drive signal is applied to both FET's and this drive signal is formed by a feedback circuit which sets the drive signal to maintain the current through the second FET dependent upon a received input signal and to maintain the potential across the second FET constant. As a result, the resistance of each FET becomes dependent only upon the received signal and not upon its inherent characteristics. The principle can be applied to other circuits, e.g., variable filters, and other resistance defining components, e.g., photo-resistors. Also, disclosed is an embodiment where only one FET is used and this is connected alternately first to a feedback circuit which derives and stores the proper signal and then the 'user' circuit to be controlled by the FET.

5 Claims, 2 Drawing Sheets

CONTROLLING A SEMI-CONDUCTOR RESISTANCE DEFINING COMPONENT

BACKGROUND OF THE INVENTION

1. Field of the Invention

The present invention relates to a method of controlling a semi-conductor resistance defining component, and more particularly, to a method and device for adjusting a drive signal to a semi-conductor resistance defining component to thereby control its electrical rsistance.

2. Descirption of the Related Art

Various semi-conductor components are or may be used as controllable resistors, the resistance between two terminals of the component being dependent upon a drive signal applied to the component. Such a component then may be coupled into an electronic circuit such that its resistance controls the characteristics of the circuit. By way of example, a field-effect transistor can be used in an automatic gain control (A.G.C.) amplifier, the drain-source resistance of the field-effect transistor being used as the gain control parameter and this resistance being varied by an AGC signal applied to the gate of the field-effect transistor.

A problem with the above device is that the tolerance on some semi-conductor resistance defining components, some field-effect transistors for example, are sufficiently wide to prevent proper design-time definition of circuits making use of the components. If a one off circuit is being made or if it is to be reproduced only a very few times, then each circuit can be individually set up and the problem of definition is not so significant. Otherwise, attempts have to be made to design out too great a dependency of the circuit characteristics upon the inherent characteristics of its components. If this is not successful, then of course the characteristics will vary from one reproduction of the circuit to another or when the relevant component is replaced.

OBJECTS AND SUMMARY OF THE INVENTION

Thus, an object of the invention is to provide a method and circuit for driving a semi-conductor resistance defining component whereby there is ensured consistent effective resistance characteristics of the component despite variations in inherent characteristics from one to another sample of that component.

According to one aspect of the invention, there is provided a method of forming a drive signal for application to one semi-conductor resistance defining component and for thereby controlling the electrical resistance between two terminals of the component, in which method the drive signal is applied to another semi-conductor resistance defining component having characteristics matching those of the one component and in which the drive signal is adjusted by feedback control means to render the current flowing between the terminals of the other component dependent upon a received signal while at the same time maintaining the potential between terminals of the other component substantially constant.

According to a second aspect of the invention, there is provided a drive circuit having a drive signal conductor connected to the control input of one semi-conductor resistance defining component, the circuit comprising another semi-conductor resistance defining component having characteristics which match those of the one component and having the drive signal conductor connected to the control input of the other component, and also comprising drive signal supply means which incorporates feedback means and which is operable to supply a drive signal to the conductor to cause the current flowing between the output terminals of the other component to be dependent upon a signal received by the supply means while at the same time maintaining constant the potential between the output terminals.

The two matched components can be field-effect transistors, preferably implemented in the form of a dual-FET device.

As noted earlier, a field-effect transistor may be used as a variable resistance controlling the gain of an AGC amplifier, the drain to source path of the field-effect transistor being connected to an amplifying component of the amplifier to act as a gain control resistor and the AGC signal being applied to the gate of the field-effect transistor. However, the drain-to-source resistance of a field-effect transistor is dependent, not only upon the drive signal applied to its gate, but also upon its inherent characteristics. Thus, several like amplifiers incorporating ostensibly like field-effect transistors as gain control elements will, unless all the field-effect transistors are closely matched one to another, have to be individually tailored to achieve the same gain control characteristics. As will be appreciated, it is not too difficult to obtain matched pairs of field-effect transistors provided that one matched pair does not have to match another. Thus, the two field-effect transistors in any one sample of any one type of dual FET device will generally match one another, but it is less likely that any two samples of the same type of dual-FET device will match each other.

In the embodiments of the invention to be described, one of two matching field-effect transistors in a dual-FET device is used as a kind of analog of the other as its drive signal is set by two feedback loops one of which ensures that the drain to source potential drop remains constant while the other causes the drain to source current to be dependent upon a received signal. As a result, the drain to source resistance of the field-effect transistor becomes substantially independent of its inherent characteristics. Meanwhile, the same drive signal is applied to the other field-effect transistor so the drain to source resistance of this transistor also becomes dependent only upon the received signal and not upon its inherent characteristics. If the dual-FET device is replaced by another, or is in two or more reproductions of the embodiment, the drive signal automatically adjusts to achieve the defined drain to source resistance. If the resistance of the field-effect transistors is to remain at a constant defined value, then of course the received signal mentioned above is derived from some fixed bias network or a reference voltage source.

BRIEF DESCRIPTION OF THE DRAWINGS

For a better understanding of the invention, reference will be made, by way of example, to the accompanying drawings, in which.

DETAILED DESCRIPTION OF THE PREFERRED EMBODIMENT

Figure 1:
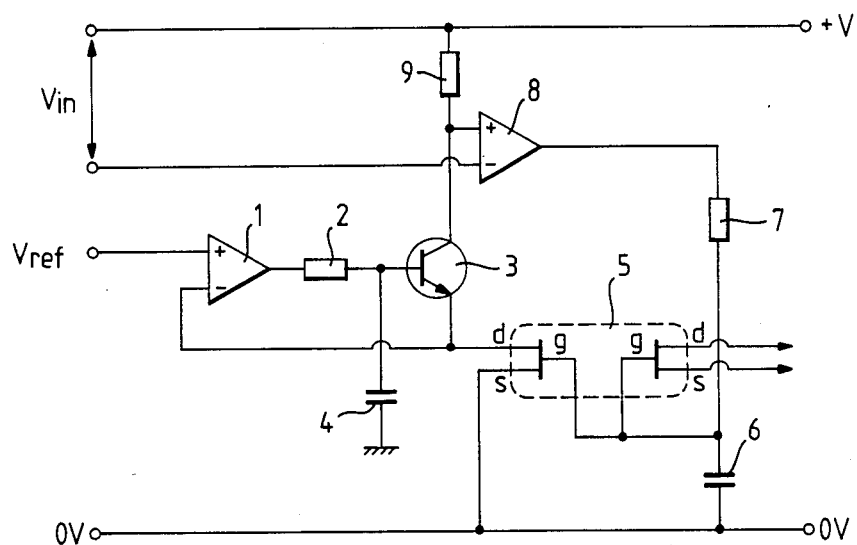
FIG. 1 is a simplified diagram of a circuit for driving the gate input of a field-effect transistor, which transistor is to form a gain defining component of another circuit (not shown)

In FIG. 1, a fixed reference voltage Vref is applied to the non-inverting input of a differential amplifier 1 having an output connected to one side of a resistor 2 of which the other side is connected to the base of an NPN transistor 3 and one side of a capacitor 4, the other side of which is grounded. The emitter of transistor 3 is connected to the inverting input of the amplifier 1 and to the drain of a first of two matched field-effect transistors contained in a dual-FET device 5. The source of this first field-effect transistor is connected to a zero volt supply rail OV along with one side of a capacitor 6 of which the other side is connected to the gates of both field-effect transistors in device 5 and, via a resistor 7, to the output of a second differential amplifier 8. The non-inverting output of amplifier 8 is connected to the collector of transistor 3 and, via a resistor 9, to a positive voltage supply rail +V. The inverting input of amplifier 8 is fed with an input voltage signal Vin which is referenced to the supply rail +V. The drain and source of the second field-effect transistor in device 5 are available for connection to another circuit (not shown) of which the second field-effect transistor is to form a component.

Amplifier 1 and transistor 3 form a first feedback loop which holds the drain of the first field-effect transistor at a constant voltage determined by Vref. This applies whatever the inherent drain to source resistance characteristics of the field-effect transistor. Meanwhile, amplifier 8 and transistor 3 form a second feedback loop which maintains the gate of the first field-effect transistor at such a voltage that the current flowing through the drain to source route of the field-effect transistor, which current also flows through resistor 9 and the collector to emitter route of transistor 3, produces a voltage at the non-inverting input of amplifier 8 balancing the signal Vin applied to the inverting input of this amplifier. Thus, for any particular value of Vin, the first field-effect transistor is forced to take up a corresponding drain-source resistance. Meanwhile, since the same gate drive is applied to the second field-effect transistor, and since this second field-effect transistor matches the first, the second transistor will take up the same drain-source resistance determined by Vref and Vin, and is substantially independent of the divergence of inherent characteristics between different samples of the same device 5.

The function of the capacitors 4 and 6 is to damp out any tendency for the two feedback loops to go into oscillation. The resistors 2 and 7 ensure that the amplifiers 1 and 8 present a high output impedance to the respective capacitors 4 and 6 which is desirable for full effectiveness of the damping. If the amplifiers already have a high output impedance, then resistors 2 and 7 may not be necessary. Indeed, one or both of the capacitors 4 and 6 might not be necessary anyway or could be discarded in favor of some other suitable oscillation damping arrangement—this of course, along with other circuit details, is a matter of choice by the circuit designer.

If the second field-effect transistor in device 5 is to define a fixed resistance, then Vin will be kept constant, i.e., the appropriate input of amplifier 8 will be connected to receive a second fixed reference voltage Vref2. Vref, and Vref2 if needed, could be obtained from a potentiometer formed by resistors (not shown) connected in series between the supply rails +V and OV.

Figure 2:
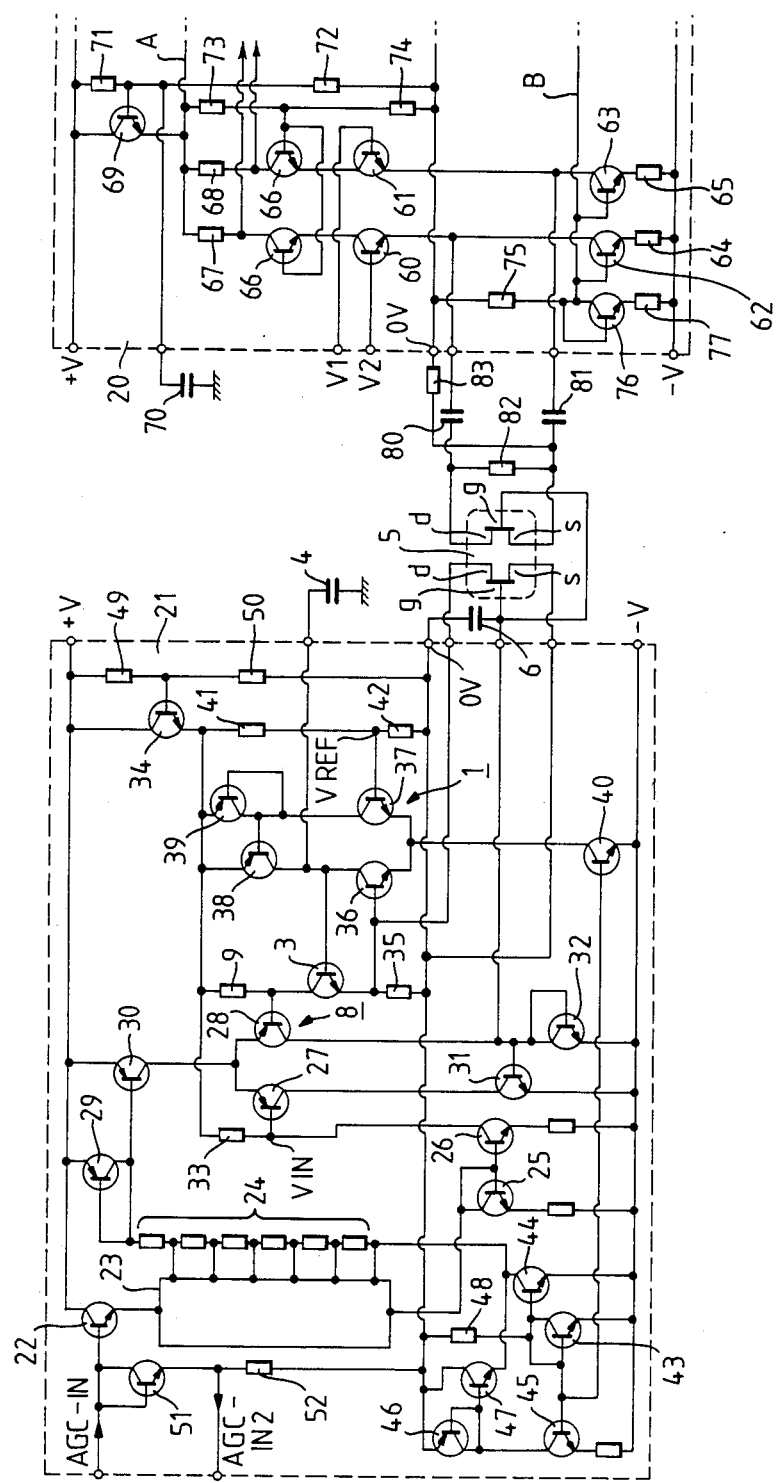
FIG. 2 is a more detailed circuit diagram of part of a gain controlled video amplifier and a gain control circuit therefor.

In FIG. 2, those parts which have equivalents in FIG. 1 have been given like reference numerals. The video amplifier 20, only the front end of which is shown, and the AGC Control circuit 21 are each implemented in the form of a semi-custom integrated circuit, i.e., an integrated circuit chip which, as first made and stocked, comprises simply a chosen set of different transistors types, resistors, diodes and connection pads. The circuit is then completed by adding the inter-component connections, i.e., by metallisation, to the customer's order. One such suitable integrated circuit is supplied by the firm Ferranti Interdesign under the name "Monochip". Because of the limitation to a pre-chosen set of components, however, some of the components shown may have to be provided off of the chip even though they are shown as if within the respective chips—this particularly applies to some of the resistors which, depending upon their values, may or may not be available on the chip. For the same reason, some of the apparently single resistors shown may in fact be made up from two or more series connected resistors.

The AGC control circuit comprises a signal input AGC-IN to which there is applied a video amplifier gain control signal. This signal is buffered by transistor 22 and applied to a control law setting circuit 23 which, to simplify the drawing, is shown only in block form. It may comprise a number of PNP transistors (not shown) of which the emitters are connected to the circuit input via respective resistors (not shown) having different chosen values; of which the collectors are connected in common to the circuit output; and of which the bases receive respective bias voltages from series resistor chain 24. Thus, as the gain control signal increases, an increasing number of the transistors switch on and contribute to the signal at the circuit output, the emitter resistor values being chosen to give an input/output relationship appropriate to the desired control law. The output signal from circuit 23, via a current mirror comprising transistors 25 and 26, drives one side of an emitter-coupled pair comprising transistors 27 and 28 and constituting the equivalent of the amplifier 8 in FIG. 1. The tail current of this pair is provided by a current mirror comprising transistors 29 and 30 which also drive one end of resistor chain 24.

As is known, a current mirror comprises two transistors with the base of one connected to its own collector and to the base of the other transistor, the two transistors having matched characteristics and close thermal coupling. The current flowing through the one transistor produces a voltage drop across that transistor which becomes applied between the base and emitter of the other transistor to cause a virtually identical collector current to flow therein. Current mirrors are often used in analog integrated circuits to replace resistors—several are used in the illustrated circuit, and the function of each will be clear to those skilled in the art. For example, the collector loads of the emitter-coupled pair 27 and 28 are formed by a current mirror comprising transistors 31 and 32—as is known, this equalizes the two collector currents to give good offset performance.

The other side of transistor pair 27,28 is connected to the collector of transistor 3. The sides of pair 27,28 (i.e., the bases of the transistors) are also connected via respective resistors 33 and 9 to the emitter of transistor 34. The emitter of transistor 3 is connected to a OV supply rail via resistor 35 and to the base of transistor 36 which, with transistor 37, forms a second emitter coupled pair corresponding to amplifier 1 in FIG. 1. The collector loads of this pair are formed by a current mirror comprising transistors 38 and 39 while its tail current control device is transistor 40.

The base of transistor 37 receives a proportion of the voltage appearing at the emitter of transistor 34, the proportion being determined by the relative values of resistors 41 and 42. The voltage applied to the base of transistor 37 thus corresponds to the signal Vref applied to the non-inverting input of amplifier 1 in FIG. 1 while the gain control signal applied to the base of transistor 27 corresponds to the signal Vin in FIG. 1. The emitter of transistor 3 is connected to the drain of a first one of two field-effect transistors in an off-chip dual FET device 5 while the collector transistor 28 is connected to the gates of both these field-effect transistors. As before, then the feedback loop through the amplifier formed by transistors 36 and 37 (the amplifier 1) and transistor 3 fixes the voltage at the drain of the first field-effect transistor, while the feedback loop formed by transistor pair 27,28 (amplifier 8) and transistor 3 sets the gate voltage of the field-effect transistor such that the drain-source current drawn thereby, which current also flows through resistor 9, balances the pair 27,28. The two loops are again damped by capacitors 4 and 6—the emitter coupled pairs in the FIG. 2 embodiment having high output impedances so no equivalents to the resistors 2 and 7 are needed.

The first gain stage of the video amplifier 20 comprises a cascade circuit including two transistors 60 and 61 of which the emitters are connected to a negative supply rail −V by way of the collector to emitter routes of respective transistors 62 and 63 and resistors 64 and 65. The collectors of transistors 60 and 61 are connected to the emitters of respective ones of two transistors 66 of which the collectors are connected, via respective resistors 67 and 68, to a circuit conductor line A. Line A is driven by transistor 69 from the positive supply rail +V, the base of this transistor being decoupled by off-chip capacitor 70, and biased by resistors 71 and 72 connected between the positive and zero supply rails +V and OV, respectively. The bases of the two transistors are biased in common by resistors 73 and 74 connected between line A and rail OV.

The bases of transistors 62 and 63 are each connected to circuit conductor line B, which line is also connected to rail OV via resistor 75 and to the base and collector of transistor 76. The emitter of transistor 76 is connected to the rail −V via resistor 77. These components set the potential on line B, transistor 76 acting as a compensating diode.

The emitters of amplifying transistors 60 and 61 are also a.c. coupled via an off-chip gain setting network which includes the second field-effect transistor in device 5. The network comprises capacitors 80 and 81 connected between the emitters of respective ones of the transistors 60 and 61 and respective ones of the drain and source of the second field-effect transistor, a resistor 82 connected between that drain and source, and a resistor 83 connected between the source and the zero volt rail OV.

Thus, the gain of the first video amplifier stage is controlled by the drain to source resistance of the second field-effect transistor which is, in turn, controlled by the gate drive applied to the first field-effect transistor. That gate drive is determined, not only by the control law modified version of the gain control signal VGC-IN applied to the base of transistor 27 in circuit 21, but also by the two feedabck loops in circuit 21 to compensate for variation in the inherent characteristics of the first field-effect transistor in device 5 and hence also, since the two field-effect transistors are matched, for variation in the characteristics of the second field-effect transistor of device 5. Consequently, the gain of amplifier 21 is better controlled and defined, say between different examples of the circuit and between replacements of the device 5 in the same reproduction.

The video input signal to be amplified is applied, via input terminals V1 and V2 of video amplifier 20, between the bases of transistors 60 and 61. The amplified output is taken from the collectors of transistors 66 and passed onto a subsequent amplifying stage (not shown) of the video amplifier. Lines A and B, and of course the supply rails +V, O and −V, also pass on for use in relation to the subsequent amplifying stage.

The subsequent amplifying stage could be gain controlled in the same way as the first. For example, it could comprise another coupled transistor pair with emitters connected via another gain control network identical to the one shown and incorporating another dual FET device of which the drain, source and gate of the first field-effect transistor and the gate of the second are driven by another gain control circuit like the circuit 21. For one particular proposed implementation (not shown) of the whole circuit 20, there is a second gain controlled stage and this is such that the associated gain control circuit has to be driven by an input signal AGC-IN2 which tracks AGC-IN but remains less than AGC-IN by the base-to-emitter voltage $V_{BE}$ of one of the on-chip transistors. To provide this, a like transistor 51 in the illustrated circuit 21 is connected as a diode between the AGC-IN input and a resistor 52 leading to the OV rail, AGC-IN2 thus becoming available as a circuit output from the emitter of the transistor. This is, of course, a useful design detail for the particular proposed implementation but it or an adaptation of it may be useful for variations of that implementation.

As well as a gain control circuit for an amplifier, the present invention could be used in other electronic circuits. For example, there could be devised an electrically controllable variable filter (not shown) in which the drain to source resistance of a field-effect transistor provides the variability of the filter characteristics, the field-effect transistor being made of one of two matched components in a dual-F.E.T. device and being controlled in the way described wtih reference to FIG. 1, for example. A further possibility would be a variable frequency oscillator (not shown) using the field-effect transistor as a frequency control element. As will be realised, in the latter case particularly, some care is needed in the design of the overall circuit. For example, at least to get the best effect, the signals handled by both of the two field-effect transistors should be about the same and it may be that this is best achieved by making the oscillator circuit which includes the field-effect transistor a so-called 'small signal' circuit.

It will also be realised that the invention is not only applicable to field-effect transistors. By way of example, another semi-conductor component having a resistance value dependent both upon a 'drive' signal as the component and upon the inherent characteristics of the component is a photo-controlled resistor. Thus, there could be devised say an optical isolator circuit (not shown) comprising two matched photo-electric resistors and a lamp which illuminates the two resistors, one of the resistors being coupled to an output of the circuit and the brightness of the lamp being controlled by a feedback circuit which causes the current flowing through the other resistor to be dependent upon an input signal to the circuit while also maintaining the potential across this other resistor constant. Such a circuit could be somewhat as shown in FIG. 1 except that the device 5 is replaced by two matched photoresistors (Not shown) while the output of amplifier 8 is applied to control the brightness of a lamp (not shown) positioned to illuminate the resistors.

In a further embodiment of the invention (not shown), the 'analog' component is not used. Instead, a kind of multiplexing system is used in which, during alternate time periods, the actual working component is first coupled to a feedback circuit so as to form the required drive signal to the component, and that signal is stored by any suitable storage means (a capacitor for example). Then, still driven by the stored signal, the component is switched over to the circuit in which its resistance value is to be used as a control feature. This circuit could again be somewhat as shown in FIG. 1 except that the device 5 is replaced by a single field-effect transistor of which the drain and source are connected via some suitable multiplexing switch arrangement either as shown in the figure or to the other circuit (not shown) which is to use the field-effect transistor as a component.

Meanwhile, the resistor and capacitor 6 are modified as necessary to maintain the drive signal, formed during each time period when the field-effect transistor is connected as shown, stored and effective through the subsequent time period when the field-effect transistor is connected to the other circuit. It will be appreciated, of course, that this embodiment is not usable in any but perhaps very few situations where the switching operations will not cause problems in the operation of the other circuit.

I claim:

1. A method of controlling the electrical resistance between two terminals of one semi-conductor resistance defining component, comprising the steps of:

applying a drive signal to a control input of said semi-conductor resistance defining component and to the control input of another semi-conductor resistance defining component having characteristics matching those of said one component; and adjusting said drive signal by feedback control means connected to the other component to render the current flowing between the terminals of the other component dependent upon a received signal while at the same time maintaining the potential between said terminals of the other component substantially constant, the adjusted drive signal causing the potential between the terminals of said one component to be substantially constant also.

2. A drive circuit for supplying a drive signal to a control input of one semi-conductor resistance defining component to control the resistance between two terminals of the component, the drive circuit comprising:

another semi-conductor resistance defining component having a control input and two terminals between which the resistance may be controlled by a drive signal applied to said control input of said another component, said another component having resistance/drive signal characteristics which at least substantially match those of said one component;

drive signal supply means connected so as to supply the same drive signal to said control inputs of said one and another components; and feedback means connected to said drive signal supply means and said another component for adjusting said drive signal to render the current flowing between the two terminals of the other component dependent upon a signal received by the drive circuit while also maintaining the potential between the two terminals of the another component substantially constant, the adjusted drive signal causing the potential between the terminals of said one component to be substantially constant also.

3. A resistance defining circuit for controlling a characteristic of a circuit component having a resistance value dependent upon a drive signal and the inherent characteristics of the circuit component, the circuit comprising:

a semi-conductor resistance defining component having a characteristic matching that of the circuit component, and having a control input and two terminals between which the resistance is controlled by the drive signal applied to said control input thereof;

drive signal supply means for supplying the drive signal to said control input of said resistance defining component and said circuit component; and feedback means connected to said drive signal supply means and to said terminals of said resistance defining component for sensing the current flowing between said terminals and the potential therebetween, and for adjusting the drive signal supplied by the drive signal supply means to render said potential substantially constant and said current dependent upon a signal received by the resistance defining circuit, the adjusted drive signal also causing the potential across said circuit component to be substantially constant.

4. A gain controlled amplifier comprising:

an amplifier circuit;

a first field-effect transistor of which the drain and source terminals are connected to said amplifier circuit, the resistance between said terminals controlling the gain of the amplifier circuit;

a second field-effect transistor of which the drain to source resistance versus gate drive characteristics at least substantially match those of the first field-effect transistor;

gain control signal supply means connected to the gate terminals of the first and second field-effect transistors for supplying a gain control signal to control the drain-to-source resistance of each field-effect transistor and hence the gain of said amplifier circuit; and feedback means connected to said gain control signal supply means and said second field-effect transistor for adjusting the gain control signal to render the potential between the drain and source terminals of the second field-effect transistor substantially constant, the adjusted drive signal also causing the potential across the drain and source terminals of the first field-effect transistor to be substantially constant.

5. An amplifier according to claim 4, wherein the first and second field-effect transistors are disposed in a dual field-effect transistor device.

* * * * *